July 27, 1954 F. J. DARKE, JR 2,685,001

EXTENDED AUTOMATIC GAIN CONTROL SYSTEM

Filed March 29, 1950

INVENTOR
FRANCIS J. DARKE, JR.
BY
ATTORNEY

Patented July 27, 1954

2,685,001

UNITED STATES PATENT OFFICE 2,685,001

EXTENDED AUTOMATIC GAIN CONTROL SYSTEM

Francis J. Darke, Jr., Princeton, N. J., assignor to Radio Corporation of America, a corporation of Delaware Application March 29, 1950, Serial No. 152,664

4 Claims. (Cl. 179—171)

This invention relates generally to the automatic gain control of a signal amplifying system. More particularly, but not necessarily exclusively, it pertains to an extended gain control arrangement especially applicable to television receiving circuits and the like.

It is common practice to provide radio broadcast and similar signal receivers with an automatic volume or gain control system to maintain the carrier voltage at the detector approximately constant. This is generally accomplished by biasing the grids of the radio frequency, intermediate frequency and converter tubes negatively with a unidirectional voltage derived by rectifying the carrier wave. An increase in signal strength increases the negative bias and tends to counteract the stronger signal by reducing the amplification, and vice versa. In this manner the receiver may be tuned from strong to weak stations without the necessity of resetting the manual volume control. Furthermore, variations in signal strength caused by fading are minimized.

Automatic gain control normally is obtained by deriving from the usual diode detector a unidirectional voltage which is proportional to the amplitude of the carrier at the diode input terminals. There generally is an added provision made for filtering out the modulation frequency currents from the rectified voltage. The time constants of the filter circuits should be long enough so that the lowest modulation frequencies do not reach the gain control circuits, but at the same time they should be short enough so that the rectified bias voltage will follow moderately rapid changes in carrier amplitude.

Another form of automatic gain control arrangement has been proposed which operates on the principle that the gain of a normally wide band amplifier can be increased by narrowing the amplified frequency pass band. This latter arrangement is particularly applicable to television circuits and the like. One such arrangement has been shown and described in the copending U. S. application of George C. Sziklai, Serial No. 759,280, filed July 5, 1947, now Patent No. 2,579,345 granted December 18, 1951, and titled "Amplifier Band Width Control." According to the proposal of Sziklai referred to immediately above, the width of the frequency pass band of an amplifying circuit is controlled either manually or automatically in accordance with the amplitude of the received signal. The copending application of Sziklai also proposes the employment of such an arrangement in connection with a stagger-tuned amplifier circuit, wherein variously tuned circuits are made to coincide in peak frequency response upon the reception of relatively weak signals.

There are many locations where neither one of the automatic gain control circuits referred to above provides entirely satisfactory results, even though employment of the "delayed" type of automatic volume control system would generally restrict automatic volume control to operation only when the incoming signal has reached a level sufficient to produce a predetermined voltage at the input of the second detector. The delayed type of automatic volume control serves no useful service in areas of weak signals. The arrangement of the type proposed by Sziklai, although extremely useful in areas of low signal strength, does not perform a useful function in areas where strong signals are available.

If both systems were to be combined, full advantage cannot be taken of the contributions of both systems because at that portion where the systems overlap, a useful result, although perhaps available with proper adjustments, is not of the type that would be desirable.

According to this invention, an arrangement is provided whereby advantage can be taken of both types of automatic gain control and wherein one form of gain control is operative while the other form of gain control is inoperative. Furthermore, a combination of the control arrangements as proposed by this invention permits an effective gain control uniformly throughout a wide range of signal strengths without producing an interruption at the transition point from one type of gain control to the other.

This invention utilizes a gain control voltage for varying the frequency response of an amplifier for signals having one range of values and for controlling grid bias to effect amplification characteristics for signals having another range of values.

A primary object of this invention is to provide an improved automatic gain control circuit for use in conjunction with a signal-amplifying system.

Another object of this invention is to provide for increased range in effective gain control of a signal-amplifying system.

Another object of this invention is to provide an improved television receiving arrangement for locations moderately remote from broadcasting stations.

Other and incidental objects of the invention will be apparent to those skilled in the art from a reading of the following specification and an inspection of the accompanying drawing in which:

Figure 4 illustrates by block and circuit diagram another form of this invention particularly applicable to television receiving arrangements and the like.

The automatic gain control system of the present invention consists essentially of two facilities operative respectively in two distinct ranges of signal amplitude. For signals below a predetermined level the frequency band pass characteristics of an amplifying system are altered automatically in response to received signal strength to increase effectively the amplification factor for low level signals. In addition, there is provided a facility for decreasing the gain or amplification factor of the amplifying system for signals above the predetermined level automatically in response to the received signals.

Figures 1, 2, 3, 5:
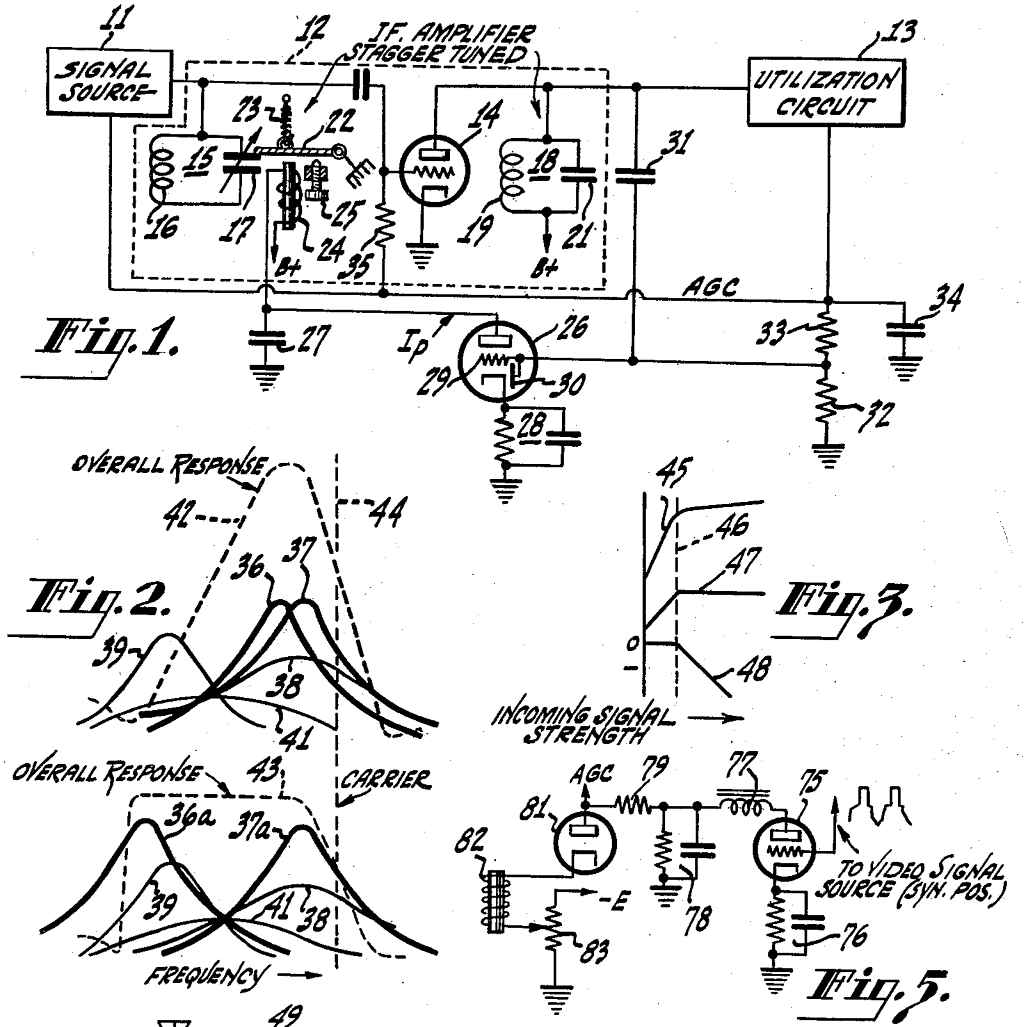
Figure 1 illustrates by circuit diagram one form of this invention.
Figure 2 and Figure 3 illustrate graphically the operation of this invention.
Figure 5 is a fragmentary circuit diagram of a television receiver embodying another form of the invention.

Accordingly, reference is made particularly to Figure 1 wherein there is disclosed, for example, a portion of an intermediate frequency amplifier of a radio receiver. The received signals will be considered as derived from a source 11. These signals are impressed upon an amplifying system 12, the output of which is coupled to a utilization circuit 13. The single source 11 may be a preceding stage of intermediate frequency amplification or it may be a frequency converting stage of a superheterodyne receiver. The utilization circuit 13 may be a second or signal detector, in the case where the signal source 11 is an intermediate frequency amplifying stage, or it may be the succeeding stage of intermediate frequency amplification, in the case where the signal source 11 is a frequency converter or first detector.

The intermediate frequency amplifier 12 includes an electron tube 14 having at least a cathode and anode and a space current control grid electrode as shown. The input circuit for the tube 14 includes a parallel resonant circuit 15 comprising a coil or inductor 16 and a capacitor 17. The output circuit of the tube 14 includes another parallel resonant circuit 18 comprising an inductor 19 and a capacitor 21. Preferably, in accordance with this invention, the resonant circuits 15 and 18 are of the stagger-tuned type.

Stagger-tuning of a plurality of resonant circuits is disclosed in the March, 1947 issue of RCA Review in an article by Antony Wright titled "Television Receivers" starting at page 7. Particular reference is made to the circuit diagram on page 8 and the related description at page 10.

In accordance with the usual practice, the stagger tuning of these circuits is for the purpose of providing a net or overall frequency response of the amplifier 12 which covers a band of signal frequencies. In the present invention, one of the stagger-tuned circuits is arranged so that its frequency response is variable. In this way, the overall frequency pass band may be altered to effect the desired gain control of the amplifier. Specifically, for the purpose principally of making a concrete, illustrative disclosure of the invention, it will be considered that the circuit 18 has a fixed frequency response while the circuit 15 is provided with facilities for varying its frequency response. Furthermore, it will be considered that normally in the absence of signals these two circuits are tuned for resonance substantially at the same predetermined frequency.

The resonance frequency of the circuit 15 is diagrammatically illustrated as being variable by a suitable variation of the capacitance value of the capacitor 17. For this purpose, the upper capacitor plate is shown mechanically attached to a pivoted member or armature 22 which normally is urged to a position remote from the fixed lower capacitor plate by a retractile spring 23. Movement of the upper capacitor plate toward the lower plate is effected under the control of a solenoid or magnet 24. The magnitude of the separation of the capacitor plates is a function of the current traversing the magnet. Movement of the upper capacitor plate toward the lower plate is limited by an adjustable stop member 25. It will be apparent that, in response to an increase in the current in the magnet winding 24, the value of the capacitor 17 is increased which results in a decrease of the frequency at which the circuit 15 is resonant. If, normally, in the absence of signals, the circuit 15 is tuned for resonance at substantially the same or perhaps a slightly lower frequency than that to which the circuit 18 is tuned, an increase in the value of the capacitor 17 produces a separation of the frequencies to which the resonant circuits are tuned.

The energizing current for the magnet 24 is derived from the anode of an electron tube 26. A capacitor 27 provides a bypass around the magnet 24. The tube 26 also is provided with a cathode which is connected to ground through a conventional self-biasing resistive-capacitive network 28. Space current in the tube 26 is controlled by a grid electrode 29. Also, if desired, the tube 26 may be provided with an auxiliary anode 30 connected to the control grid 29 as shown and forming a diode rectifier with the cathode of the tube. Space current in the tube 26 is made responsive to variations of signal strength by a coupling including a capacitor 31 between the output of the amplifier 12 and the control grid 29.

There also is provided a load impedance device shown as a resistor 32 for the rectifier comprising the cathode and the control grid 29 serving as an anode in conjunction with the diode anode 30. Unidirectional voltages are developed in the load resistor 32 as a result of signal rectification by the control grid 29 and the diode anode 30 of the tube 26. A filter network including a series resistor 33 and a shunt capacitor 34 is connected between the rectifier load resistor 32 and an automatic gain control bus AGC. The automatic gain control bus is connected to the amplification controlling electrodes of the different stages of the radio receiver in a conventional manner. For example, the automatic gain control bus is connected to the control grid of the intermediate frequency amplifier tube 14 by a resistor 35.

The operation of the automatic gain control system in accordance with this invention will be further described with additional reference to the curves of Figures 2 and 3. The curves of Figure 2 are generally representative of stagger-tuned circuits as described in the Wright article referred to previously. In the upper set of curves of Figure 2, the curves 36 and 37 represent respectively the normal response of the resonant circuits 15 and 18 of Figure 1. These conditions obtain in the absence of any received signals. It will be noted that the curves 36 and 37 approximately coincide except that the curve 36 is peaked at a slightly lower frequency than that at which the curve 37 is peaked. It will be understood, however, that if desired, the curves may be made to exactly coincide. The curves 38, 39 and 41 represent the frequency responses, respectively, of the other circuits (not shown) of a complete amplifying system. The broken line curve 42 of Figure 2 represents the overall response characteristic of the complete signal-amplifying system including the stage 12. It is to be noted that the overall response of the amplifier is relatively sharp and is of appreciable amplitude. As a consequence, the gain or amplification factor of the system including the stage 12 is at a maximum.

If, now, it be assumed that a relatively weak signal is received, a relatively small signal voltage will be impressed by the capacitor 31 upon the control grid 29 of the tube 26. There will be produced a small increase in the anode current of this tube which, in traversing the magnet 24, will cause a small decrease in the separation of the plates of the capacitor 17. The frequency at which the circuit 15 is resonant, therefore, is decreased, thereby increasing the pass band of the amplifier 12 and effecting a small decrease in the gain of the stage. Further increases in the signal strength result in further broadening of the amplifier frequency pass band with attendant reductions in the amplifier gain.

When a point is reached at which the signal voltage impressed upon the control grid 29 of the tube 26 is of such a character to produce substantially maximum anode current, the control grid of this tube begins to draw current. Preferably, the stop 25 is adjusted to prevent further relative movement of the plates of the capacitor 17 at this point. Consequently, the band of frequencies passed by the amplifying system including the stage 12 is substantially as represented by the broken line 43 of the lower set of curves of Figure 2. This overall frequency response of the amplifier is changed from that previously described by the combined effect of the two substantially different frequencies at which the respective circuits 15 and 18 are tuned. As shown in the lower set of curves of Figure 2, the response by the output resonant circuit 18 is represented by the curve 37*a* while the response of the input circuit 15 is shown by the curve 36*a*. It will be noted that the curves 37 and 37*a* are at the same frequency while the curve 36*a* has been shifted to a materially lower frequency than that of the curve 36. The broken line 44 represents the signal-modulated carrier wave frequency as related to the band pass frequencies of the amplifier.

The current drawn by the control grid 29 of the tube 26 effects, in conjunction with the cathode of this tube, signal rectification by which to develop a unidirectional voltage in the load resistor 32. The magnitude of this unidirectional voltage varies directly with the strength of the signals derived through the capacitor 31. It will be seen that the provision of an additional anode 30 for signal rectification purposes enhances the rectification. The voltages developed in the resistor 32 are filtered in the usual manner by means of the network including resistor 33 and capacitor 34. These voltages are of negative polarity relative to ground and, therefore, when impressed upon the control grids of the various receiver stages such as the amplifying tube 14 produce a decrease in the gain or amplification of the respective stages. In other words, gain control by this means is effected in a conventional manner.

It is to be especially noted that the automatic gain control system in accordance with this invention operates to decrease the gain of the various receiver stages in the usual manner in response to received signals of greater than a predetermined strength. However, in response to received signals of less than the predetermined strength, the present system functions effectively to increase the gain of certain of the signal amplification stages. The net result, therefore, is that with respect to signals of greater than a predetermined strength, there is provided an automatic gain control system which is of the delayed type. In other words, the gain-decreasing facilities do not begin to function until the received signals are of greater than a predetermined strength. Such a system is effectively combined with one such as that described for increasing the amplifier gain for signals of less than a predetermined strength. Accordingly, the present system maintains a substantially uniform output for received signals varying through considerably wider ranges than is provided by prior art systems.

The operation of the different portions of the automatic gain control system of Figure 1 is illustrated graphically in Figure 3. The curve 45 represents the variation of the anode current of the tube 26 with variations of received signal voltages impressed upon the control grid 29 thereof. It will be noted that the curve 45 which is the equivalent of the characteristic curve of an electron tube is substantially linear in the region to the left of the broken vertical line 46 representing the point of transition in the present system between the two types of gain controlling facilities. To the right of line 46 the curve 45 levels off to a substantially constant value representing space current saturation in the tube 26.

The curve 47 represents the variation in the change in the capacitance value of the capacitor 17 of Figure 1. To the left of the broken line 46 for signals of less than a predetermined strength the capacitor 17 increases in value in a substantially linear manner. To the right of the line 46 the capacitance of the capacitor 17 remains unchanged at its increased value substantially as described. The curve 48 represents the unidirectional voltage developed in the resistor 32 and impressed upon the automatic gain control bus AGC. It will be seen that, to the left of the broken line 46 for signals of less than a predetermined value, the automatic gain control voltage is substantially zero. Also, to the right of the line 46 for signals of greater than the predetermined strength, the automatic gain control voltage increases in negative magnitude substantially as described.

It will be appreciated that this invention is generally useful in most types of radio receiving circuits. However, it is considered that it is particularly useful in television receivers, and the like.

Automatic gain control facilities for television receivers, while not absolutely necessary in many instances, are in certain other instances more important than in sound receivers. Proper manual gain control adjustments in television receivers are often difficult to make. Furthermore, the levels of the received television signals are more critical for the reason that the amplitude limiter, the sync signal separation circuits and the direct current level setting apparatus all depend for best performance upon the maintenance of the proper signal amplitudes. Television signals, by reason of their nature, are subject to distortion as a result of violent fading. The adverse results of such signal transmitting hazards can be materially reduced or entirely eliminated by the employment of suitable automatic gain controlling facilities in the receiving circuits.

Perhaps even more important in television systems is the necessity for providing a relatively wide range of amplifier gain control. One of the reasons for this is the fact that television carrier frequencies are more susceptible to violent fading produced by disturbances such as passing airplanes. Also, the range through which the received signal levels vary is likely to be relatively great because of the distance between transmitters and receivers, the comparatively small number of television transmitters presently operating, the fact that the transmission paths follow substantially the line of sight, and the like.

Accordingly, it is necessary that facilities be provided for controlling automatically the gain of television receiving circuits over a much wider range of signal level variations than usually encountered in sound receiving systems.

Figure 4:
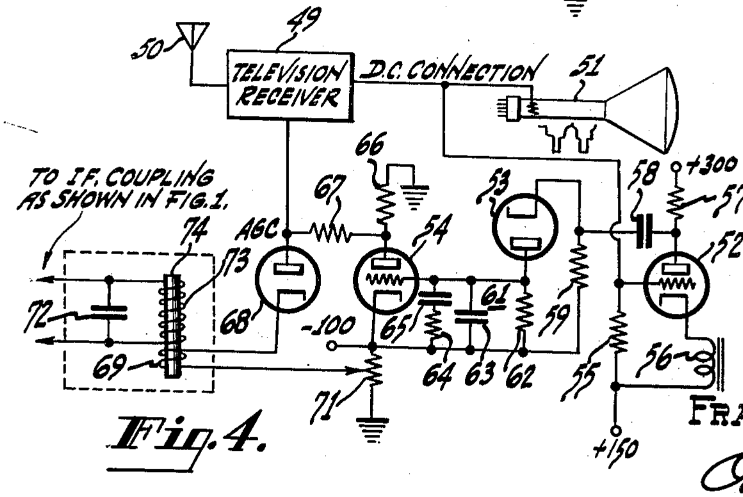

Reference will now be made to Figure 4 of the drawing showing a modification of the present invention which is particularly useful for television signal receivers, and the like. A conventional television signal receiver 49 is shown coupled to an antenna 50. It will be understood that the receiver 49 may conform substantially to that shown in the Wright article previously referred to. The video signal channel of the receiver 49 is shown connected in a conventional manner to an image reproducing device such as a kinescope 51.

The remainder of the circuit diagram shown in this figure consists of an embodiment of the automatic gain controlling apparatus of the present invention. There is employed a so-called inverted keyed AGC circuit substantially of the type disclosed in an article appearing at page 385 of the September 1948 issue of the RCA Review by K. R. Wendt titled "A New Fast Noise-Immune Television AGC Circuit". The form of the Wendt gain control circuit specifically disclosed herein is that appearing in Figure 9 of the referenced article. The Wendt system includes a keyed electron tube 52, a diode rectifier tube 53 and an amplifying electron tube 54.

As indicated, the video signals together with the blanking and synchronizing signals are impressed in negative polarity upon the control grid of the keyed tube 52. The input circuit of this tube also includes a resistor 55 and a coil winding 56 of a transformer which may be the horizontal deflection output transformer or any other suitable source of pulses of negative polarity. The output circuit of the tube 52 includes a load resistor 57. This tube is normally biased to a non-conducting state and is rendered operative periodically under the control of the pulses derived from the source 56. The degree of conductivity of the tube 52 during these periods is determined by the amplitude level of the video signals impressed upon the control grid thereof. For example, in response to a video signal of high level or amplitude, the control grid of the tube 52 is driven more negative so as to reduce or completely interrupt current conduction therein so that there is developed at the anode a pulse of small amplitude. Low level video signals produce pulses of large amplitude.

The anode of the tube 52 is coupled by a capacitor 58 to the cathode of the diode 53. A resistor 59 provides a suitable load circuit impedance for the diode in which to develop a pulsating unidirectional voltage representative of the video signal amplitude. The diode is provided with a filter network 61 including a parallel circuit arrangement of a resistor 62, a capacitor 63 and the series connection of a resistor 64 and capacitor 65. The diode 53 serves to rectify the pulses of varying amplitude derived from the anode of the tube 52 so that a resultant unidirectional video signal level representative voltage may be impressed upon the control grid and cathode of the amplifier tube 54.

It will be seen that, by reason of the employment of an alternating current type of coupling between the diode 53 and the tube 52, the unidirectional voltage impressed upon the control grid of the amplifier tube 54 is of negative polarity in response to low level video signals and is of positive polarity for high level video signals. Consequently, it will be observed that the tube 54 serves to invert the polarity of the unidirectional voltage representing the video signal level so as to develop across a load resistor 66 connected to the anode of the tube a unidirectional voltage which is of negative polarity for high level video signals. This voltage, therefore, is suitable to control the gain of the television receiver circuits in a conventional manner. Accordingly, the anode of the tube 54 is connected to the usual AGC bus through a resistor 67.

In accordance with conventional practice, the present invention provides a means for suitably delaying the impression of the developed automatic gain control voltage upon the television receiver 49 until the received video signal strength has reached a predetermined level. In accordance with this invention, the delay feature is provided in a somewhat different manner than ordinarily. Furthermore, the present form of the invention includes apparatus for varying the overall frequency pass band of the signal-amplifying stages of the receiver for received video signals of less than the predetermined level. The band width control and delay facilities are combined in accordance with this invention in a manner to effect more efficient operation of the system.

A circuit connected in shunt with the space discharge path of the tube 54 includes the resistor 67, a unilaterally conducting device such as the delay diode 68, a winding 69 and a potentiometer 71 which is connected between the cathode of the tube 54 and ground. In this illustrative form of the invention, the resonant circuit which is to be provided with means for varying its frequency response includes a shunt-connected capacitor 72 and a coil 73. These circuit components may correspond to the capacitor 17 and coil 16 of Figure 1. In this case, the coil 73 is provided with a core 74 having the property of a permeability which is variable in accordance with the direct current saturation thereof. Such cores are well known and are generally used in radio receiver circuits for tuning purposes. In general, they may be of materials known as ferrites, certain alloys of molybdenum, magnetite, etc. In the present case, as the energization of the winding 69 varies, a corresponding variation in the saturation and hence the permeability of the core 74 is effected. A resultant corresponding change in the effective inductance of the coil 73 is produced, whereby to change the resonant frequency of the circuit.

It is seen that, in response to negative voltages of relatively small amplitudes developed at the anode of the tube 54 as a result of the reception of relatively low level video signals, the potentiometer 71 may be adjusted suitably to render the cathode of the diode 68 more negative than the anode. Consequently, the diode is conductive in response to video signals below a predetermined level. In an extreme case with no video signals present, the diode has maximum conductivity. Consequently, the magnitude of the current traversing the winding 69 is a maximum. The coil 73 has a minimum inductance and the resonant circuit is tuned to a maximum frequency.

As the strength of the video signals increases, the current conductivity in the diode 68 and in the winding 69 decreases, thereby increasing the inductance of the coil 73 and decreasing the resonant frequency of the circuit. Thus, the response curves of the signal amplifier are separated more widely in the frequency spectrum substantially in the manner described with reference to the embodiment of the invention in Figure 1.

At the video signal level where maximum overall frequency response of the amplifier covers the desired band of frequencies, the biasing of the diode 68 by means of the setting of the potentiometer 71 is such as to interrupt current conduction in the diode and the winding 69. Further variations of the resonant frequency of the circuit including this coil thereby are prevented. At the same time, the shunting of the tube 54 by the diode 68 is eliminated. Further increases in the video signal level, therefore, are effective to develop voltages at the anode of the tube 54 which are impressed upon the gain controlling facilities of the television receiver 48 in a conventional manner to further decrease the gain of the system.

Figure 5 to which reference now will be made illustrates another embodiment of the invention, as it may be used in conjunction with an automatic gain control system of the type disclosed in U. S. Patent No. 2,615,089 of G. F. Rogers, granted October 21, 1952 and titled "Keyed Automatic Gain Control System." The Rogers gain control system is in some respects similar to the Wendt system shown in the embodiment of the present invention of Figure 4 in that it is of the keyed type. It consists essentially of an electron tube 75 upon the control grid of which the video signals are impressed in such a manner that the synchronizing pulses are of positive polarity as indicated. A self-biasing network 76 is connected to the cathode of the tube in a conventional manner. The anode of the tube is connected through a coil or transformer winding 77 and a conventional filter network 78 to ground. As in the form of the invention shown in Figure 4, the coil 77 may be a secondary winding of a transformer included in the horizontal deflection generator. In any case, there are produced pulses in the coil 77 substantially concurrently with the reception of the synchronizing signals.

The tube 75 normally is non-conducting and is periodically keyed to a conducting state by means of the pulses developed in the coil 77. In the form of this type of automatic gain control system disclosed in the Rogers patent referred to, the self-biasing network 76 is made adjustable for the purpose of setting the level at which the tube 75 is effective to develop an automatic gain control voltage in the filter network 78. In the present case, however, the parameters of the biasing network 76 are chosen so that the tube 75 is responsive to the weakest received video signals during the periods when it is rendered conductive by the pulses developed in the coil 77.

The filter network 78 in which there is developed a unidirectional voltage of negative polarity relative to ground in accordance with the received signal strength is shunted by a circuit which includes a series arrangement of a resistor 79, a diode 81, a frequency-controlling coil 82 and a potentiometer 83. The potentiometer is connected between a suitable source of negative voltage indicated as —E and ground. The cathode of the diode 81 is suitably biased by adjusting the potentiometer 83. The setting of this potentiometer effectively controls the amount of automatic gain control delay and at the same time controls the range of frequencies through which one of the stagger-tuned resonant circuits of the amplifier is varied.

The coil 82 may form the winding of a solenoid or electromagnet such as the magnet 24 of Figure 1, whereby to vary the capacitance of a resonant circuit or it may be the equivalent of the coil 69 of Figure 4 by which the inductance of the resonant circuit is varied. The anode of the diode 81 is connected to the gain controlling circuits of the television receiver circuits in a conventional manner as indicated.

It will be seen that, when very weak signals are received, a relatively small negative voltage will be developed in the filter network 78. Under these conditions, the negative biasing of the cathode 81 as determined by the adjustment of the potentiometer 83 will be of a greater negative magnitude. In other words, the anode of the diode is at a positive potential relative to its cathode, whereby the device conducts a maximum of current which traverses the coil 82.

In the event that the energization of this coil controls the effective inductance of the resonant circuit as in the form of the invention shown in Figure 4, it is seen that this effective inductance has a minimum value. Accordingly, the frequency to which the resonant circuit is tuned is relatively high; coinciding substantially with the output resonant circuit of the stagger-tuned arrangement.

In the event that the coil 82 is employed to vary the capacitance of the resonant circuit, it will be understood that suitable mechanical linkage similar to that shown in Figure 1 will be provided to produce a minimum capacitance of the resonant circuit. In such a case, with reference to the mechanical linkage shown in Figure 1, the system of Figure 5 will require that the armature be linked to the lower capacitor plate, whereby to cause a maximum separation between the plates of the capacitor.

As the received signals increase in strength, the magnitude of the negative voltage developed in the filter network 78 increases correspondingly. As a result, the diode 81 is less conductive than formerly whereby to reduce the magnitude of the current traversing the coil 82. Where this coil is employed to control the effective inductance of the resonant circuit, it is seen that the saturation of the core is decreased, thereby increasing the effective inductance of the resonant circuit. Consequently, the resonant circuit is tuned to a somewhat lower frequency than in the previously described instance. Similarly, where the capacitance of the resonant circuit is controlled by the coil 82, the electromagnet which influences the movable armature permits it to be retracted, thereby decreasing the separation between the capacitor plates. In this case, also, it is seen that the frequency to which the resonant circuit is tuned is decreased.

In either of these two cases, it is seen that the circuit which includes the diode 81 effectively shunts the filter network 78, thereby preventing the unidirectional voltage developed in this network from being impressed upon the gain-controlling facilities of the television receiver circuits. When, however, the strength of the received signals increases to the point where the diode 81 is rendered non-conducting, the coil 82 is no longer energized. Consequently, no further change may be effected in the tuning of the resonant circuit. At this point, however, the two stagger-tuned resonant circuits will have responses such as indicated by the curves 36$a$ and 37$a$ of Figure 2. The diode 81, therefore, no longer serves to delay the impression of the unidirectional gain-controlling voltage developed in the network 78 upon the control grids of the various receiver tubes. Further increases in the signal strength serve to develop negative unidirectional voltages of increased magnitudes in the filter network 78 by which to effectively reduce the gain of the television receiver in a conventional manner.

Thus, it may be seen, by reference to the foregoing description of several illustrative embodiments of the invention, that there is provided an improved automatic gain control system. By use of an arrangement in accordance with this invention, not only may the gain of any amplifying system be reduced as the received signals increase in strength, but also the effective amplifier gain may be increased for signals which are weaker than average. Accordingly, the range of signal strengths over which the amplifier gain may be controlled is substantially increased as compared to conventional systems.

Furthermore, it may be seen that, from the viewpoint of prior art delayed automatic gain control systems, the present system functions to provide the same beneficial delay. Moreover, it may be seen that the effective delay of the automatic gain control system is achieved in a somewhat different manner than previously. Particularly, with reference to the embodiments of the invention shown in Figures 4 and 5, the delay is produced by shunting the circuit or network in which the automatic gain controlling voltage is developed.

The present system, however, is particularly advantageous in that ordinarily the energy which is developed as a result of the operation of the facilities provided for delay purposes is gainfully employed instead of being dissipated as heat as in the prior art systems. The desired delayed automatic gain control is effected in the form of the invention shown in Figure 1 by the novel use of the electron tube 26, whereby the conventional automatic gain control voltage is developed as a result of grid current rectification. The delay is produced by suitably biasing the tube so that grid current rectification does not occur until the received signals have reached a predetermined strength. The increased efficiency of the gain control voltage developing circuits of the present invention is achieved by utilizing the space current variations in the tube 26 for controlling the amplifier gain by means of the resonant amplifier response characteristic.

It also should be noted in this connection that, aside from an automatic gain control system, the use of an electron tube such as the tube 26 of Figure 1 for achieving one type of control by means of anode current and another type of control by grid current increases the effectiveness or efficiency of such a device. At the same time, the two types of controls are automatically correlated by reason of the inherent functioning of the electron tube. More specifically, such an arrangement provides that, as soon as one type of control is rendered ineffective, the other type of control becomes operative.

Furthermore, the embodiments of the invention shown in Figures 4 and 5 are particularly well adapted for use in the video signal circuits of a television receiver.

The nature of the invention may be determined by those skilled in the art from the foregoing description of several illustrative embodiments thereof. The scope of the invention is set forth in the following claims.

What is claimed is:

1. Signal amplification apparatus comprising a signal-amplifying stage including an amplifying device and two circuits associated therewith tuned normally for resonance substantially at the same predetermined frequency, whereby to provide said stage with a relatively narrow frequency pass band, means responsive to a predetermined range of signal strength variations to vary the resonance frequency of one of said circuits, whereby to provide said stage with a frequency pass band having a width varying with signal strength variations, and additional means responsive to a different range of signal strength variations to vary the gain of said amplifying device.

2. In an automatic gain control system for a signal amplifier, two circuits coupled to said amplifier and normally tuned to resonance at substantially the same frequency, whereby to provide said amplifier with a relatively narrow frequency pass band, means including a signal rectifier for developing a unidirectional voltage having a magnitude representative of signal strength, means coupling said rectifier to said amplifier to impress said unidirectional voltage upon said amplifier in a manner to reduce the amplifier gain, a shunt circuit around said voltage-developing means including a diode biased for conduction to delay the impression of said unidirectional voltage upon said amplifier for signals of less than a predetermined strength, and means in said shunt circuit coupled to one of said tuned circuits to vary its resonance frequency, whereby to vary the frequency pass band of said amplifier for signals of less than said predetermined strength.

3. In a television receiver, an automatic gain control system for a video signal amplifier, comprising two circuits coupled to said amplifier and normally tuned to resonance at substantially the same frequency, whereby to provide said amplifier with a relatively narrow frequency pass band, means including a keyed signal rectifier for developing a unidirectional voltage representative of video signal strength at recurring short intervals, means coupling said rectifier to said amplifier to impress said unidirectional voltage upon said amplifier in a manner to control the amplifier gain for signals of greater than a predetermined strength, a shunt circuit around said voltage-developing means including a diode biased to delay the impression of said unidirectional voltage upon said amplifier for signals of less than said predetermined strength, and current responsive means in said shunt circuit coupled to one of said tuned circuits to vary its resonance frequency, whereby to vary the frequency pass band of said amplifier for signals of less than said predetermined strength.

4. Signal amplification apparatus comprising a signal amplifying stage including an amplifying device and two circuits associated therewith tuned normally for resonance substantially at the same predetermined frequency, whereby to provide said stage with a relatively narrow frequency pass band, a source of signals, an electron tube having a cathode, an anode and a control grid, means coupling said signal source to said control grid, an anode-cathode circuit for said tube including means for controlling the frequency of one of said tuned circuits whereby to vary the resonance frequency of said one tuned circuit by anode current variations in response to a predetermined range of signal strength variations, thereby to provide said stage with a frequency pass band having a width varying with signal strength variations, and means coupled to the control grid-cathode circuit of said electron tube and responsive to grid current variations produced by a different range of signal strength variations to vary the gain of said amplifying device.

References Cited in the file of this patent

UNITED STATES PATENTS

| Number | Name | Date |
|---|---|---|
| 2,152,618 | Wheeler | Mar. 28, 1939 |
| 2,166,693 | Riddle, Jr. | July 18, 1939 |
| 2,170,475 | Hahn | Aug. 22, 1939 |
| 2,273,639 | Haantjes | Feb. 17, 1942 |
| 2,280,563 | Weinberger | Apr. 21, 1942 |
| 2,579,345 | Sziklai | Dec. 18, 1951 |